(12) United States Patent
Wong

(10) Patent No.: US 6,602,743 B2
(45) Date of Patent: Aug. 5, 2003

(54) METHOD OF MANUFACTURING A FLAT PANEL DISPLAY

(75) Inventor: Jia-Fam Wong, Hsinchu (TW)

(73) Assignee: Au Optronics Corp., Hsihchu (TW)

( * ) Notice: Subject to any disclaimer, the term of this patent is extended or adjusted under 35 U.S.C. 154(b) by 0 days.

(21) Appl. No.: 09/916,828

(22) Filed: Jul. 26, 2001

(65) Prior Publication Data

US 2002/0061611 A1 May 23, 2002

(30) Foreign Application Priority Data

Nov. 23, 2000 (TW) .......................... 89124912 A

(51) Int. Cl.⁷ .......................... H01L 21/00; H01L 21/04
(52) U.S. Cl. .......................... 438/151; 438/157; 438/156; 438/155; 349/39; 349/86; 349/106; 349/110; 349/139
(58) Field of Search .......................... 349/39, 86, 106, 349/110, 139, 149, 150, 155; 438/151, 152, 155, 157

(56) References Cited

U.S. PATENT DOCUMENTS 5,748,266 A * 5/1998 Kodate .......................... 349/39
6,031,590 A * 2/2000 Kim .......................... 349/86

* cited by examiner

*Primary Examiner*—Hoai Ho
*Assistant Examiner*—Reneé R. Berry
(74) *Attorney, Agent, or Firm*—Ladas & Parry

(57) ABSTRACT

A method of manufacturing a flat display is disclosed. First, a first substrate having a first thickness is provided. The first substrate includes a first display area and a first pad area, and a pad electrode is formed in the first pad area and a passivation layer is formed on the pad electrode. Next, a second substrate having a second thickness is provided. The second substrate includes a second display area and a second pad area, the second display area is opposite to the first display area, and the second pad area is opposite to the first pad area. The first substrate and the second substrate are then sealed by a sealing material. After removing the second pad area of the second substrate, the passivation layer on the first pad area is then removed to expose the pad electrode. At the same time, the thickness of the first substrate is reduced from the first thickness to the third thickness.

13 Claims, 4 Drawing Sheets

METHOD OF MANUFACTURING A FLAT PANEL DISPLAY

BACKGROUND OF THE INVENTION

1. Field of the Invention

The invention relates to a method of manufacturing a flat panel display, and more particularly to a method for thinning a flat panel display and preventing a pad electrode in a pad area from oxidizing.

2. Description of the Related Art

Recently, in order to fulfill the requirements of high-speed image processes and high quality image displays, flat panel displays, such as the color liquid crystal display (LCD), are enormously popular. The LCD usually includes a lot of pixels, each pixel has a thin film transistor (TFT) to switch on/off the pixel.

Generally, the LCD has an upper and a lower substrate having a plurality of electrodes thereon, respectively. These substrates are sealed with adhesive materials, and a liquid crystal material is sealed between these two substrates. Before the liquid crystal is injected between the two substrates, spacers are sprayed between the substrates in order to hold a constant distance therebetween. Conventionally, many TFTs are formed above the lower substrate as switching devices. Each TFT has a gate electrode connected to a scanning line, a drain electrode connected with a signal line, and a source electrode connected to a pixel electrode. The upper substrate includes a color filter and a common electrode.

FIG. 1A through FIG. 1C are sectional views illustrating a conventional method of manufacturing a liquid crystal display.

As shown in FIG. 1A, a first substrate 1 having a pad area I and a display area II is provided. A pad electrode 3 is formed on the pad area I. The pad electrode 3 is made of metal, such as Cr, Ta, Mo, Ti, or Al. A plurality of TFTs are formed on the display area II. Each TFT has a gate electrode 4, a source electrode 11, and a drain electrode 12. An insulating layer 5 is formed on the gate electrode 4. A semiconductive layer 6 is formed on the insulating layer 5. The doped silicon layers 8, 9 are formed on the semiconductive layer 6. A source electrode 11 is formed on the doped silicon layer 8, and a drain electrode 12 is formed on the doped silicon layer 9. A pixel electrode 14 is formed on the source electrode 11 and the drain electrode 12. The pixel electrode 14 is usually made of Indium Tin Oxide (ITO). Finally, a passivation layer 16 is formed to cover the first substrate 1.

As shown in FIG. 1B, in the pad area I, the passivation layer 16 and the insulating layer 5 are patterned by a suitable photolithography and etching process, and thus the pad electrode 3 is exposed. The exposed pad electrode 3 is used to connect with an external circuit.

As shown in FIG. 1C, a second substrate 2 with a predetermined size is provided. Before the liquid crystal is injected between the first substrate 1 and the second substrate 2, these substrates 1, 2 are sealed by a sealing material 18 at the appropriate temperature of 150° C. –250° C. The sealing material 18 is spread on the periphery of the two substrates 1, 2.

The above-mentioned method for fabricating the liquid crystal display, however, has the problems described below.

(1) A heating step is needed during the sealing process. At the same time, the surface of the metal pad electrode may be oxidized to form a metal oxide. A short circuit may happen between the pad electrode and the external circuit, and the signal transmission may be poor because of the metal oxide.

(2) There is no step for thinning the substrate in the prior method. An extra step for reducing the thickness of at least one substrate is added when a thinner display is needed.

SUMMARY OF THE INVENTION

It is an object of the present invention to provide a method of manufacturing a flat display in which the thickness of at least one substrate is reduced without any excess steps.

Another object of the invention is to provide a method of manufacturing a flat display, in which a pad electrode is not easily to be oxidized.

To achieve the above objects, a method of manufacturing a flat display according to the invention is disclosed. First, providing a first substrate having a first thickness. The first substrate includes a first display area and a first pad area, a pad electrode is formed in the first pad area, and a passivation layer is formed on the pad electrode. Next, providing a second substrate having a second thickness. The second substrate includes a second display area and a second pad area, the second display area is opposite to the first display area, and the second pad area is opposite to the first pad area. The first substrate and the second substrate are assembled and sealed by a sealing material. The second pad area of the second substrate is removed by a cutting process. The passivation layer on the first pad area is then removed by an etching process in order to expose the pad electrode. The first substrate also becomes thinner in the etching process. Therefore, the thickness of the first substrate is reduced from the first thickness to the third thickness.

The thickness of both the first and second substrates can be reduced by the etching process while the passivation layer is removed. Therefore, the thickness of the second substrate is reduced from the second thickness to the fourth thickness.

The etching process can be a wet-etching process. The ratio of the etching rate $R_{pass}$ of the passivation layer to the etching rate $R_{subs}$ of the first or second substrate is in a range of 10:1 to 1000:1 according to the required thickness of the passivation layer and the substrates.

A plurality of thin film transistors are formed on the first substrate, and a color filter is formed on the second substrate. The method of manufacturing the flat display further includes a step of injecting the liquid crystal material between the first and second substrates after the step (C).

One feature of the invention is that the pad electrode is exposed by removing a part of the passivation after the first and second substrates are assembled and sealed. Therefore, the pad electrode will not be oxidized during the sealing process, and a better connection is provided between the pad electrode and the external circuit.

Another feature of the invention is that the thickness of the first and second substrates can be reduced by the same etching process for removing the passivation layer. Therefore, a lighter display can be made without adding any extra step.

Another feature of the invention is that the step of removing the passivation layer within the pad area is shifted to one step of packaging the TFT liquid crystal display. Therefore, one mask for forming an opening to expose the pad electrode can be eliminated, thus the manufacturing cost can be reduced.

BRIEF DESCRIPTION OF THE DRAWINGS

This and other objects and features of the invention will become clear from the following description, taken in conjunction with the preferred embodiments with reference to the drawings, in which.

DETAILED DESCRIPTION OF THE PREFERRED EMBODIMENTS

FIG. 2A through FIG. 2D are sectional views illustrating a method of manufacturing a flat display according to the present invention.

Figure 1A:
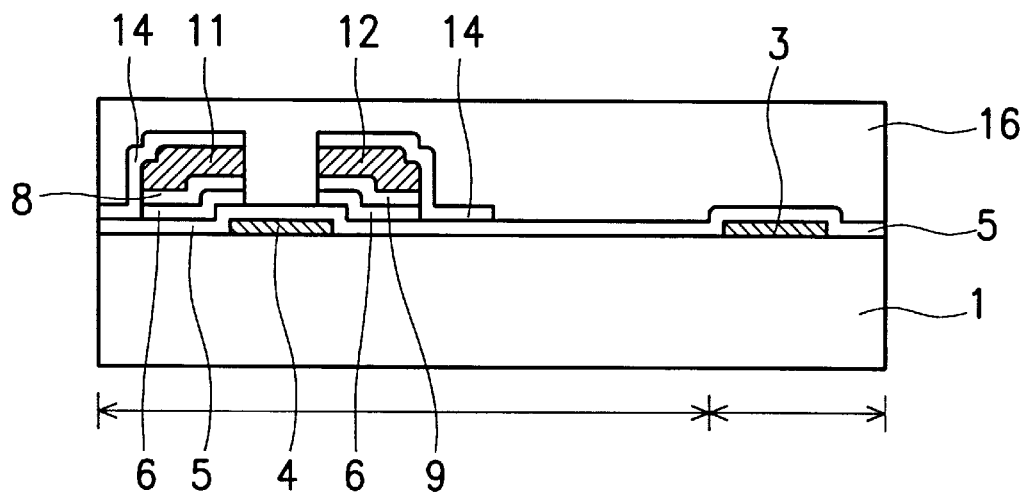
FIGS. 1A to 1C are sectional views showing a conventional method of manufacturing a flat display.
Figure 1B:
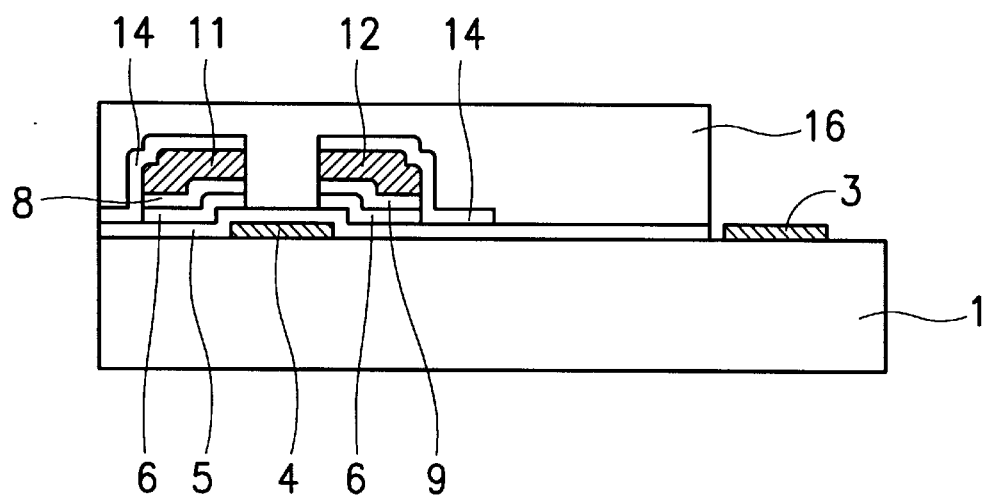
Figure 1C:
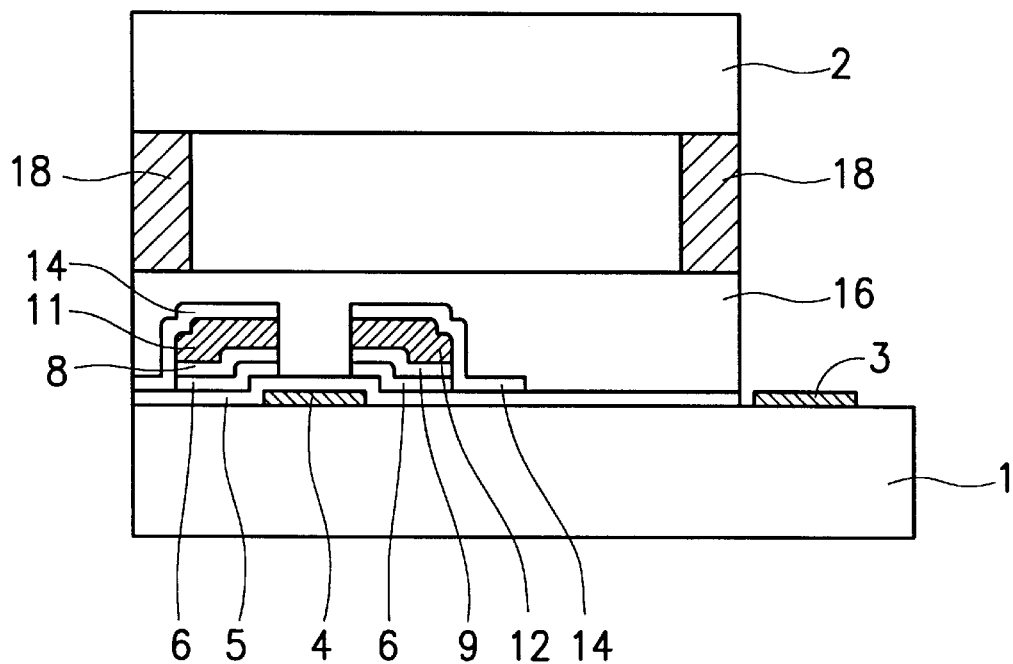
Figure 2A:
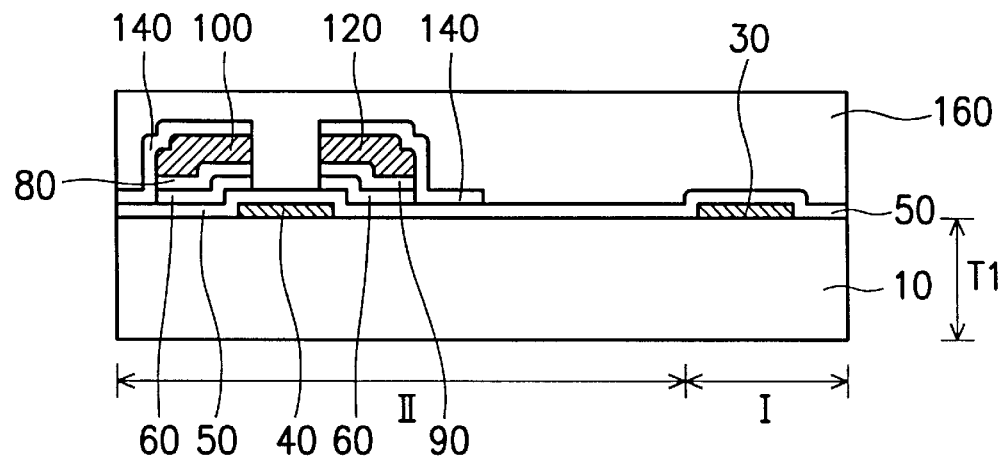
FIGS. 2A to 2D are sectional views showing a method of manufacturing a flat display according to the present invention.

Referring to FIG. 2A, a first substrate 10 has a first thickness T1, and the first substrate 10 includes a first pad area I and a first display area II. A pad electrode 30 is formed on the first pad area I of the first substrate 10. The pad electrode 30 is made of metal, such as Cr, Ta, Mo, Ti, or Al. A thin film transistor (TFT) having a gate electrode 40, source electrode 100 and a drain electrode 120 is formed on the first display area II of the first substrate 10. An insulating layer 50 made of the dielectric material is formed on the gate electrode 40. A semiconductor layer 60 is then formed on the insulating layer 50. The doped silicon layers 80, 110 are formed above the semiconductor layer 60. The pixel electrode 140 is formed on source electrode 100 and the drain electrode 120. The pixel electrode 140 is preferably made of ITO. A passivation layer 160 is formed to cover the first substrate 10. The passivation layer 160 is usually made of a silicide, such as $SiN_x$, or $SiO_x$.

Figure 2B:
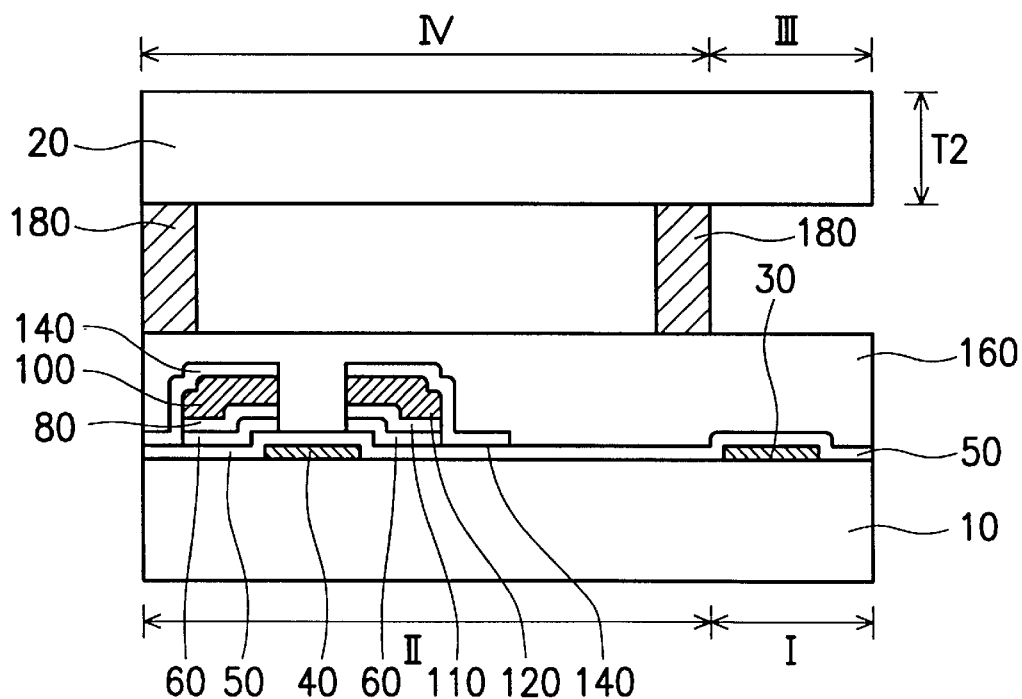

Next, referring to FIG. 2B, a second substrate 20 having a second pad area III and a second display area IV is provided. As the first substrate 10 and the second substrate 20 are assembled, the second pad area III is opposite to the first pad area I, and the second display area IV is opposite to the first display area II.

After a pre-sealing process, the liquid crystal material is injected between the first substrate 10 and the second substrate 20. Further, the first substrate 10 and the second substrate 20 are finally sealed by a heating process at the appropriate temperature of 150° C.–250° C. The substrates 10, 20 are sealed by a sealing material 180 which is spread on the periphery of the first substrate 10 and the second substrate 20.

Figure 2C:
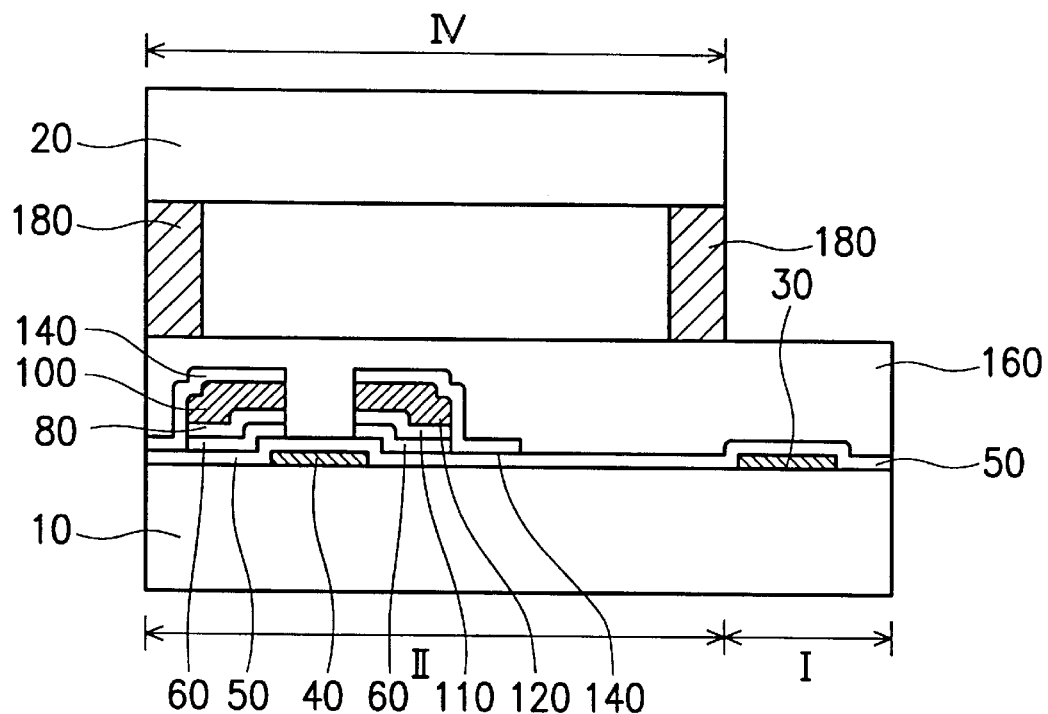

Referring to FIG. 2C, a portion of the second substrate 20 is removed by a cutting process. Therefore, the second pad area III of the second substrate 20 is removed, and the passivation layer 160 on the first pad area I of the first substrate 10 is exposed.

Figure 2D:
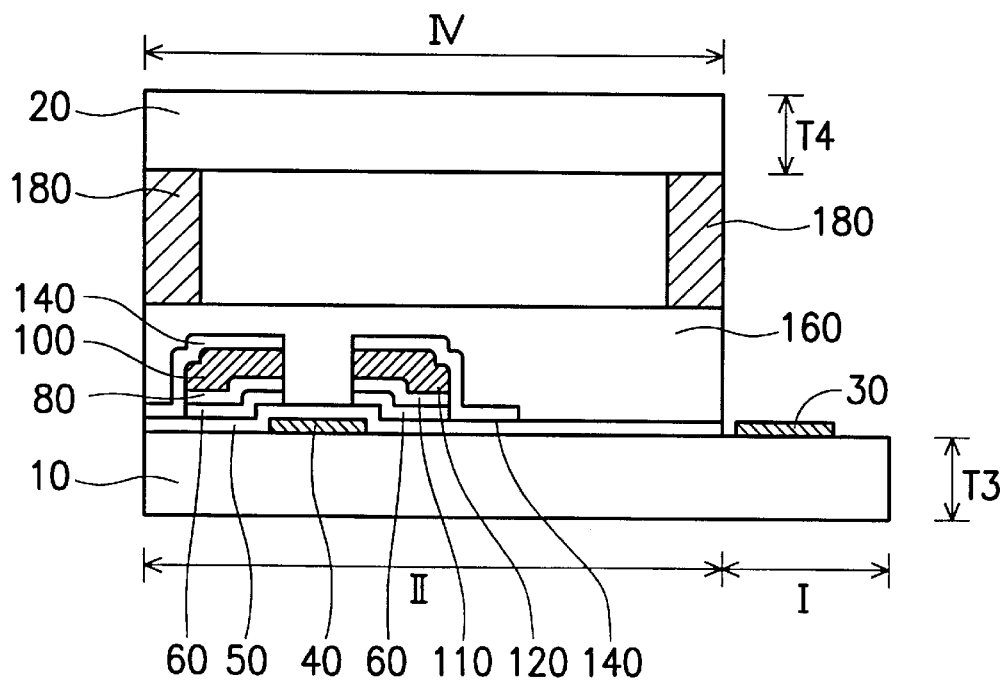

Next, referring to FIG. 2D, the passivation layer 160 and the insulating layer 50 on the first pad area I are removed by a wet-etching process to expose the pad electrode 30. For example, the first and second substrates 10, 20 are dipped in the HF acid liquid, and then the pad electrode 30 is exposed by etching away parts of the passivation layer 160 and the insulating layer 50 on the first pad area I. The pad electrode 30 is used to connect with the external circuits for driving the display. The HF acid liquid can remove parts of the passivation layer 160, the insulating layer 50, the first substrate 10, and the second substrate 20. The wet-etching conditions vary according to the required thickness of the passivation layer 160 and the two substrates 10, 20. The ratio of the etching rate $R_{pass}$ of the passivation layer 160 to the etching rate $R_{subs}$ of the first substrate 10 or the second substrate 20 is defined within a range of 10:1 to 1000:1. In the etching process, the passivation layer 160 and the insulating layer 50 in the first pad area I are etched, and a part of the two substrates are also etched. Therefore, the thickness of the first 10 and second substrates 20 can be reduced while etching the passivation layer 160. The thickness of the first substrate 10 is reduced from the first thickness T1 to the third thickness T3, and the thickness of the second substrate 20 is reduced from the second thickness T2 to the fourth thickness T4. Moreover, the surfaces of the first 10 and second substrates 20 can be polished by performing a polishing process.

In the prior method for manufacturing a flat display, an opening of the passivation layer in the pad area is formed by a mask, and then the pad electrode is exposed in the opening. However, in the invention, the above step is changed to one step in the packaging process of the TFT LCD. The step is changed to be a step of removing the passivation layer within the pad area. Therefore, one mask for forming an opening within the pad area to expose the pad electrode is eliminated in the present invention, thus reducing the manufacturing cost.

In the invention, the passivation layer in the pad area is removed to expose the pad electrode after the first and second substrates are assembled. In the same process, the thickness of the first and second substrates can also be reduced. Therefore, the invention has the advantages of: (1) preventing the pad electrode from oxidizing, and thus providing a preferable electric connection between the pad electrode and the external circuits; (2) reducing the thickness of the first and second substrate to fabricate a lighter display without adding any extra step; (3) reducing the steps for forming thin film transistor, and thus reducing the manufacturing time and cost.

While the preferred embodiment of the present invention has been described, it is to be understood that modifications will be apparent to those skilled in the art without departing from the spirit of the invention. The scope of the invention, therefore, is to be determined solely by the following claims.

What is claimed is:

1. A method of manufacturing a flat display, comprising the steps of:

(a) providing a first substrate having a first display area and a first pad area, the first substrate having a first thickness, and the first pad area having a pad electrode and a passivation layer formed on the pad electrode;

(b) providing a second substrate having a second display area and a second pad area, the second substrate having a second thickness, the second display area being opposite to the first display area, and the second pad area being opposite to the first pad area;

(c) assembling and sealing the first substrate and the second substrate by a sealing material;

(d) removing the second pad area of the second substrate; and (e) removing the passivation layer on the first pad area to expose the pad electrode, and reducing the thickness of the first substrate from the first thickness to a third thickness at the same time.

2. The method of manufacturing a flat display as claimed in claim 1, wherein the second pad area of the second substrate is removed by a cutting process in the step (d).

3. The method of manufacturing a flat display as claimed in claim 1, wherein the thickness of the second substrate is reduced while the passivation layer is removed, and thus the thickness of the second substrate is reduced from the second thickness to a fourth thickness.

4. The method of manufacturing a flat display as claimed in claim 1, wherein the step (e) is accomplished by a wet-etching process.

5. The method of manufacturing a flat display as claimed in claim 1, wherein a plurality of thin film transistors are formed on the first substrate, and a color filter is formed on the second substrate.

6. The method of manufacturing a flat display as claimed in claim 1, further comprising a step of injecting the liquid crystal materials between the first and second substrates after step (C).

7. The method of manufacturing a flat display, comprising the steps of:
   (a) providing a first substrate having a display area and a pad area, the first substrate having a first thickness, and the pad area having a pad electrode and a passivation layer formed on the pad electrode;
   (b) providing a second substrate having a second thickness;
   (c) assembling and sealing the first substrate and the second substrate by a sealing material;
   (d) removing the passivation layer on the pad area to expose the pad electrode.

8. The method of manufacturing a flat display as claimed in claim 7, wherein a step of cutting a portion of the second substrate opposite to the pad electrode is performed before the step (d).

9. The method of manufacturing a flat display as claimed in claim 7, wherein a step of cutting a portion of the second substrate opposite to the pad electrode is performed after the step (d).

10. The method of manufacturing a flat display as claimed in claim 7, wherein the thickness of the first and second substrates are also reduced in the step (d), and thus the first substrate has a third thickness and the second substrate has a fourth thickness.

11. The method of manufacturing a flat display as claimed in claim 9, wherein a wet-etching process is performed in the step (d).

12. The method of manufacturing a flat display as claimed in claim 7, wherein a plurality of thin film transistors are formed on the first substrate in the step (a), and a color filter is formed on the second substrate in the step (b).

13. The method of manufacturing a flat display as claimed in claim 7, wherein a step of injecting the liquid crystal materials between the first and second substrates after the step (C).

* * * * *